(12) United States Patent
Oh et al.

(10) Patent No.: US 7,859,064 B1
(45) Date of Patent: Dec. 28, 2010

(54) SEMICONDUCTOR DEVICES INCLUDING CHANNEL AND JUNCTION REGIONS OF DIFFERENT SEMICONDUCTOR MATERIALS

(75) Inventors: Chang-woo Oh, Gyeonggi-do (KR); Dong-gun Park, Gyeonggi-do (KR); Dong-won Kim, Gyeonggi-do (KR); Sung-dae Suk, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 342 days.

(21) Appl. No.: 11/849,577

(22) Filed: Sep. 4, 2007

Related U.S. Application Data (62) Division of application No. 11/190,254, filed on Jul. 26, 2005, now Pat. No. 7,271,456.

(30) Foreign Application Priority Data

Jul. 27, 2004 (KR) .................... 10-2004-0058785

(51) Int. Cl.
*H01L 29/41* (2006.01)
(52) U.S. Cl. ............... 257/401; 257/368; 257/E29.113; 257/349
(58) Field of Classification Search ............. 257/401, 257/349, 368, E29.113
See application file for complete search history.

(56) References Cited

U.S. PATENT DOCUMENTS

| 6,342,410 | B1 | 1/2002 | Yu |
| 6,380,558 | B1 * | 4/2002 | Yamazaki et al. ............. 257/57 |
| 6,413,802 | B1 | 7/2002 | Hu et al. |
| 6,475,869 | B1 | 11/2002 | Yu |
| 6,611,029 | B1 | 8/2003 | Ahmed et al. |
| 6,867,433 | B2 * | 3/2005 | Yeo et al. ...................... 257/67 |
| 7,005,330 | B2 * | 2/2006 | Yeo et al. ..................... 438/157 |
| 7,138,302 | B2 * | 11/2006 | Xiang et al. ................. 438/142 |
| 2003/0201458 | A1 | 10/2003 | Clark et al. |
| 2005/0224889 | A1 * | 10/2005 | Oh et al. ..................... 257/369 |

OTHER PUBLICATIONS

T. Ghani et al; *A 90nm High Volume Manufacturing Logic Technology Featuring Novel 45nm Gate Length Strained Silicon CMOS Transistors*, Proceedings of the 2003 International Election Devices Meeting.

T. Ghani et al; *A 90nm High Volume Manufacturing Logic Technology Featuring Novel 45nm Gate Length Strained Silicon CMOS Transistors*, Proceedings of the 2003 International Election Devices Meeting (SLIDES).

Korean Office Action for Korean Patent Application No. 10-2004-0058785 mailed on Feb. 28, 2006.

* cited by examiner

*Primary Examiner*—Victor A Mandala
(74) *Attorney, Agent, or Firm*—Myers Bigel Sibley & Sajovec, P.A.

(57) ABSTRACT

A semiconductor device may include a substrate, an active semiconductor region of the substrate, and a gate electrode. The active semiconductor region may include a channel region between first and second junction regions. The channel region may include a first semiconductor material, the first and second junction regions may include a second semiconductor material, and the first and second semiconductor materials may be different. The gate electrode may be on the channel region with portions of the first and second junction regions being free of the gate electrode.

13 Claims, 13 Drawing Sheets

SEMICONDUCTOR DEVICES INCLUDING CHANNEL AND JUNCTION REGIONS OF DIFFERENT SEMICONDUCTOR MATERIALS

RELATED APPLICATIONS

This application claims the benefit of priority as a divisional of U.S. application Ser. No. 11/190,254 filed Jul. 26, 2005, now U.S. Pat. No. 7,271,456 which claims the benefit of priority to Korean Patent Application No. 2004-58785, filed on Jul. 27, 2004, in the Korean Intellectual Property Office. The disclosures of both of the above referenced applications are hereby incorporated herein in their entirety by reference.

FIELD OF THE INVENTION

The present invention relates to electronics, and more particularly, to semiconductor devices.

BACKGROUND

It is known that the performance of a transistor may depend on an operation current of the transistor. Therefore, efforts have been made to provide high operation currents for transistors. In particular, strained silicon channel (SSC) techniques have been studied wherein stress is applied to a channel region.

SSC techniques may provide a strained channel layer on an upper part of a metal oxide silicon field effect transistor (MOSFET) by forming a stress inducing layer. SSC techniques have been disclosed in the article by T. Ghani et al. entitled "A 90 nm high volume manufacturing logic technology featuring novel 45 nm gate length strained silicon CMOS Transistor" (IEEE in 2003).

However, even if a stress inducing layer covers a bulk type MOSFET, stress provided by the stress inducing layer may be distributed in a substrate since the body area (or thickness of the substrate) of a MOSFET is relatively large compared to the thickness of the stress inducing layer. Accordingly, it may be difficult to obtain a high mobility of carriers and there may be a limit in obtaining a high operating current of the MOSFET.

SUMMARY

According to embodiments of the present invention, a semiconductor device may include a substrate and a fin shaped semiconductor region on the substrate. The fin shaped semiconductor region may include a channel region and first and second junction regions on opposite sides of the channel region. A gate electrode may be provided on the channel region of the fin shaped semiconductor region, and a stress inducing layer may be provided on the fin shaped semiconductor region. The stress inducing layer, for example, may include at least one of silicon oxide and/or silicon nitride.

The substrate may include a semiconductor-on-insulator substrate with a base semiconductor layer and a buried oxide layer, and the fin shaped semiconductor region may be on the buried oxide layer opposite the base semiconductor layer. Moreover, the fin shaped semiconductor region may include at least one of silicon, germanium, and/or silicon germanium. The base semiconductor layer may be silicon.

The gate electrode may extend across a surface of the fin shaped semiconductor region opposite the substrate and along portions of sidewalls of the fin shaped semiconductor region toward the substrate. Moreover, the stress inducing layer may include at least one of a silicon oxide layer and/or a silicon nitride layer. The stress inducing layer may be on sidewalls of the gate electrode and the fin shaped semiconductor region, and surfaces of the gate electrode and the fin shaped semiconductor region opposite the substrate may be free of the stress inducing layer. The stress inducing layer may be on sidewalls of the fin shaped semiconductor region and on a surface of the fin shaped semiconductor region opposite the substrate.

In addition, an isolation layer may be provided on the substrate and on portions of sidewalls of the fin shaped semiconductor region, the first and second junction regions being free of the isolation layer. The isolation layer may also be between portions of the gate electrode and the substrate. Moreover, the stress inducing layer may include a continuous stress inducing layer extending on the gate electrode and on the first and second junction regions of the fin shaped semiconductor region.

The gate electrode may cross the fin shaped semiconductor region, and the gate electrode may extend in a direction perpendicular to the fin shaped semiconductor region. In addition, a gate insulating layer may be provided between the gate electrode and the fin shaped semiconductor region. More particularly, the gate insulating layer may be a gate oxide layer.

The semiconductor device may also include a mask layer between portions of the gate electrode and a surface of the fin shaped semiconductor layer opposite the substrate. In addition, a gate insulating layer may be provided between portions of the gate electrode and sidewalls of the fin shaped semiconductor layer, and the gate oxide layer may have a thickness less than a thickness of the mask layer.

The first and second junction regions may have a p-type conductivity, and the stress inducing layer may be a silicon oxide layer. In an alternative, the first and second junction regions may have an n-type conductivity, and the stress inducing layer may be a silicon nitride layer.

The stress inducing layer may include first and second stress inducing layers. The first stress inducing layer may be on sidewalls of the fin shaped semiconductor region with portions of the first stress inducing layer being between the gate electrode and the substrate. The second stress inducing layer may be on the gate electrode such that the gate electrode is between portions of the first and second stress inducing layers. A surface of the fin shaped semiconductor region opposite the substrate may be free of the first stress inducing layer, and portions of the second stress inducing layer may be on the surface of the fin shaped semiconductor regions opposite the substrate.

The stress inducing layer may extend between at least a portion of the fin shaped semiconductor region and the substrate. The channel region may include a first semiconductor material, the first and second junction regions may include a second semiconductor material, and the first and second semiconductor materials may be different. More particularly, the first and second semiconductor materials may have different lattice constants.

According to other embodiments of the present invention, a semiconductor device may include a substrate and an active semiconductor region on the substrate. The active semiconductor region may include a channel region between first and second junction regions, and the channel region may include a first semiconductor material. The first and second junction regions may include a second semiconductor material, and the first and second semiconductor materials may be different. In addition, a gate electrode may be provided on the channel region with portions of the first and second junction regions being free of the gate electrode. Moreover, the first and second semiconductor materials may have different lattice constants.

The first and second junction regions may have a p-type conductivity, and the second semiconductor material may have a lattice constant that is greater than a lattice constant of the first semiconductor material. More particularly, the first semiconductor material may include silicon, and the second semiconductor material may include silicon germanium (SiGe). In an alternative, the first and second junction regions may have an n-type conductivity, and the second semiconductor material may have a lattice constant that is less than a lattice constant of the first semiconductor material. More particularly, the first semiconductor material may include silicon germanium (SiGe) and the second semiconductor material may include silicon. In addition, the active semiconductor region may be a fin shaped semiconductor region extending away from the substrate.

According to yet other embodiments of the present invention, a semiconductor device may include a base semiconductor layer and a buried insulator layer on the base semiconductor layer. An active semiconductor region may be provided on the buried insulator layer so that the buried insulator layer is between the active semiconductor region and the base semiconductor layer. In addition, the active semiconductor region may include a channel region and first and second junction regions on opposite sides of the channel region. Moreover, a gate electrode may be provided on the channel region of the active semiconductor region, and a stress inducing layer may be provided on the active semiconductor region. More particularly, the stress inducing layer may include at least one of silicon oxide and/or silicon nitride.

Embodiments of the present invention may provide a semiconductor device that provides a high operating current by applying stress to a thin channel layer. According to some embodiments of the present invention, a semiconductor device may include a semiconductor substrate having a thin film active region and a MOSFET composed of a gate electrode formed on the active region and junction regions. Stress may be applied to the MOSFET (especially to a channel layer of the MOSFET) by a stress apply film placed on the semiconductor substrate.

According to other embodiments of the present invention, a semiconductor device may include a semiconductor substrate on which an isolation layer that defines a fin shaped active region is formed. A gate electrode may be formed to cross the active region, a junction region may be formed on the active region on both sides of the gate electrode, and a stress apply film may be formed to cover the semiconductor substrate.

According to still other embodiments of the present invention, a semiconductor device may include a semiconductor substrate on which an isolation layer that defines a fin shaped active region is formed. A first stress apply film may be formed to fill both sides of the active region, a gate electrode may be formed on a predetermined portion of the active region and the first stress apply film, and junction regions may be formed on the active region on both sides of the gate electrode. In addition, a second stress apply film may be formed to cover the active region, the first stress apply film, and a surface of the gate electrode.

According to yet other embodiments of the present invention, a semiconductor device may include a semiconductor substrate on which an isolation layer that defines a fin shaped active region is formed. A gate electrode may be formed to cross the active region, and junction regions may be formed on the active region on both sides of the gate electrode. In addition, a stress apply film may extend into an inner side of the semiconductor substrate to surround an upper part and sides of the active region, a surface of the gate electrode, and a lower surface of the junction regions.

The gate electrode may overlap with both sides of the active region having a gate oxide film therebetween, and an upper surface of the active region may further include an active mask that defines the active region. Also, the stress apply film can be extended into the semiconductor substrate to surround a lower surface of the channel layer formed between the junction regions.

As an example, if a dopant injected into the junction region is a p-type dopant, the stress apply film can be a silicon oxide film, and if the dopant injected into the junction region is an n-type dopant, the stress apply film can be a silicon nitride film.

A semiconductor device according to embodiments of the present invention may include a gate electrode formed on a semiconductor substrate and a predetermined portion of the semiconductor substrate. A junction region formed of a stress inducing material may be formed on the semiconductor substrate on a lower part of the gate electrode and may be formed to a fin shape on the semiconductor substrate on both side of the gate electrode.

If the semiconductor substrate is formed of silicon, the junction region can be formed of a silicon germanium (SiGe), and if the semiconductor substrate is formed of SiGe, the junction region can be formed of silicon (Si).

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
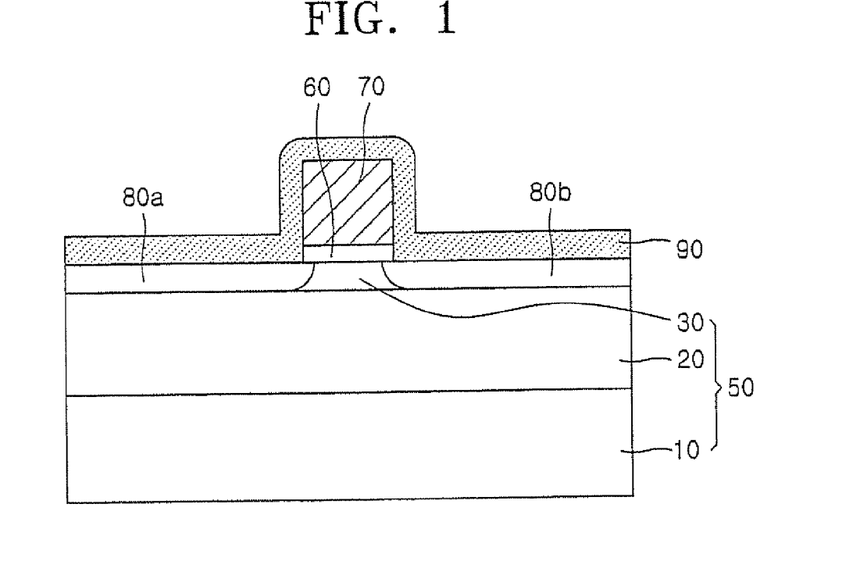
FIG. 1 is a cross-sectional view illustrating Silicon-On-Insulator (SOI) semiconductor devices according to embodiments of the present invention.

FIG. 1 is a cross-sectional view of a SOI semiconductor device according to embodiments of the present invention. Referring to FIG. 1, a gate electrode 70 is formed on a SOI substrate 50. As it is known, the SOI substrate 50 may include a base silicon 10, a buried oxide film 20, and a silicon layer 30. At this time, the silicon layer 30, on which a device may be substantially formed, may have a thickness of a few nm to a few μm, which may be about the same thickness as a junction depth and which may be thinner than a thickness of the silicon layer of the SOI substrate 50.

A gate insulating film 60 may be formed between the gate electrode 70 and the silicon layer 30. Junction regions 80a and 80b may be formed on the silicon layer 30 on both sides of the gate electrode 70. Lower surfaces of junction regions 80a and 80b can be bordered by the buried oxide film 20. A MOSFET may thus be formed on the SOI substrate 50. Also, the SOI substrate 50 can be a substrate structured as an insulating film-semiconductor layer, such as a Ge-On-Insulator (GOI) or a SiGe-On-Insulator (SGOI).

A stress apply film 90 may be formed on the SOI substrate 50 on which the MOSFET is formed. The stress apply film 90 may be formed to provide stress to a channel layer of the MOSFET and a material for forming the stress apply film 90 may vary according to the main carrier. For example, if holes serve as the main carrier (in case of a PMOSFET), the mobility of the holes can be increased by applying compressive stress to the channel layer of the PMOSFET. In this case, a silicon oxide film can be used as the stress apply film 90. On the other hand, if electrons serve as the main carrier (in case of an NMOSFET), the mobility of the electrons can be increased by applying tensile stress to the channel layer of the NMOSFET. In this case, a silicon nitride film can be used as the stress apply film 90. The stress apply film 90 may be formed to a thickness of approximately 0.01-100 nm to be able to apply sufficient stress to the thin silicon layer 30.

According to embodiments of the present embodiment, a thickness of the channel layer (that is, the silicon layer 30) may be remarkably reduced as compared to a conventional MOSFET to increase a magnitude of stress to be applied to the channel layer. Therefore, the mobility of the carrier can be increased by the relative increase in the magnitude of stress applied to unit area of the channel layer, thereby improving an operating current of the MOSFET.

Figure 2:
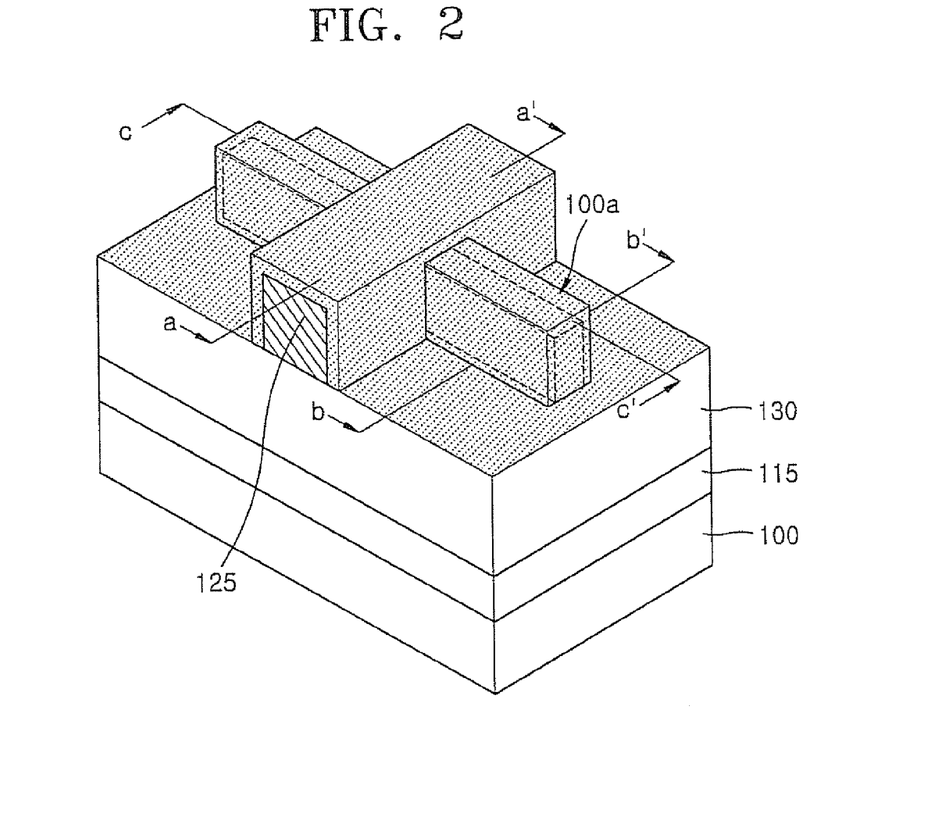
FIG. 2 is a perspective view of Fin-Field-Effect (FinFET) transistors according to embodiments of the present invention.
Figure 3:
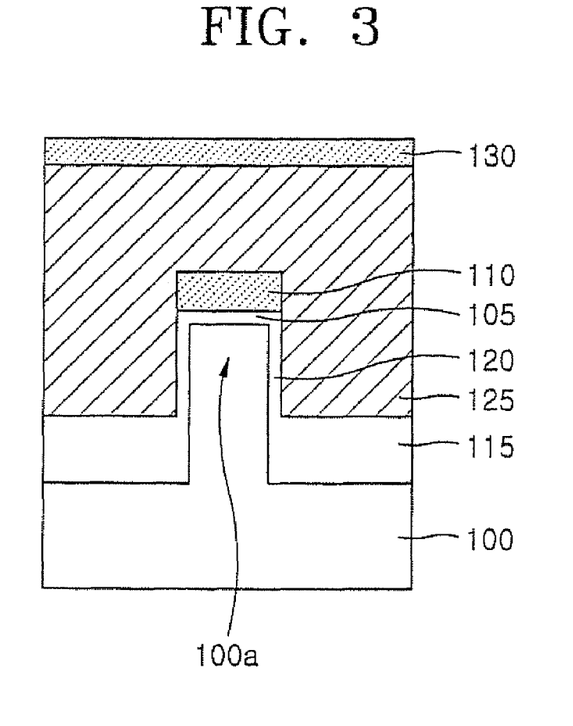
FIG. 3 is a cross-sectional view taken along line a-a' of FIG. 2.
Figure 4:
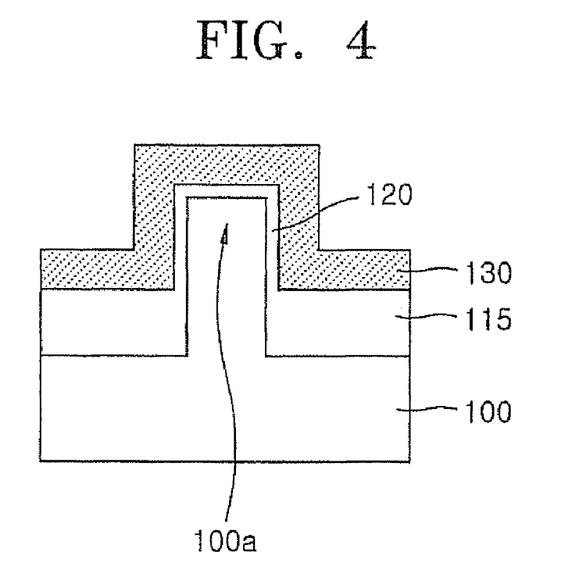
FIG. 4 is a cross-sectional view taken along line b-b' of FIG. 2.
Figure 5:
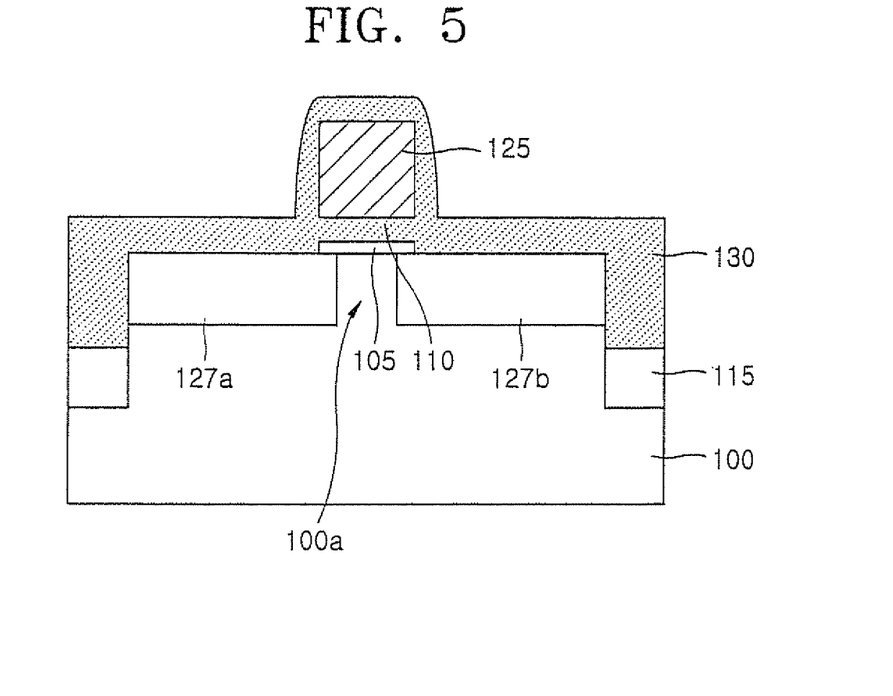
FIG. 5 is a cross-sectional view taken along line c-c' of FIG. 2.

FIG. 2 is a perspective view of a FinFET transistor according to embodiments of the present invention. FIG. 3 is a cross-sectional view taken along line a-a' in FIG. 2, FIG. 4 is a cross-sectional view taken along line b-b' in FIG. 2, and FIG. 5 is a cross-sectional view taken along line c-c' in FIG. 2.

Referring to FIGS. 2 through 5, an active mask 110 for defining an active region is formed on a semiconductor substrate 100. The semiconductor substrate 100 can be, for example, a Si substrate, a SOI substrate, a GOI substrate, or a SiGeOI substrate, and the active mask 110 can be a silicon nitride film having an anti-oxidation characteristic. A pad oxide film 105 may be provided between the semiconductor substrate 100 and the active mask 110 to improve adhesion therebetween. An isolation layer 115 may be formed by filling an insulating material in a trench (not shown) formed by etching portions of the semiconductor substrate 100 exposed by the active mask 110.

An active region 100a having a fin shape (side surfaces of which are exposed) may be defined by etching the isolation layer 115 to a predetermined depth to expose side surfaces of the active region. A gate oxide film 120 may be formed on side surfaces of the exposed active region 100a, and a gate electrode 125 may be formed to cross a portion of the active region 100a. At this time, although the gate electrode 125 may be formed to cover three surfaces of the fin shaped active region 100a, the gate electrode 125 may substantially overlap both surfaces of the active region 100a because the active mask 110 remains between the gate electrode 125 and an upper part of the active region 100a. Junction regions 127a and 127b may be formed by implanting a dopant into the fin shaped active region 100a on both sides of the gate electrode 125, thereby completing formation of a FinFET.

A stress apply film 130 may be coated on an entire surface of the semiconductor substrate 100 on which the FinFET is formed using a blanket method without a mask (or a resist pattern). The stress apply film 130 may be evenly coated on an upper part and side surfaces of the junction regions 127a and 127b and an upper part and side surfaces of the gate electrode 125. The stress apply film 130 may be a silicon oxide film if the dopant implanted into the junction regions 127a and 127b is a p-type dopant. The stress apply film 130 may be a silicon nitride film if the dopant implanted to the junction regions 127a and 127b is an n-type dopant.

In addition, a silicide film can further be formed on the surfaces of the gate electrode 125 and the junction regions 127a and 127b before forming the stress apply film 130. The stress apply film 130 may then be formed to cover an upper part of the FinFET on which the silicide film is formed.

As described above, the gate electrode 125 may have a double gate shape since the gate electrode 125 overlaps both side surfaces of the active region 100a with a gate oxide film 120 therebetween.

Figure 6:
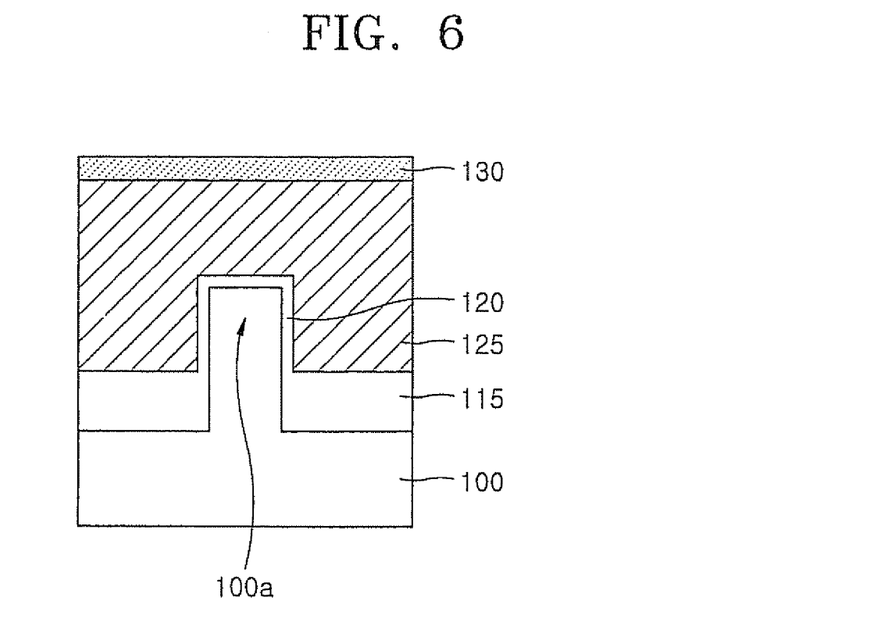
FIG. 6 is a cross-sectional view taken along line a-a' of FIG. 2 after removing an active mask.
Figure 7:
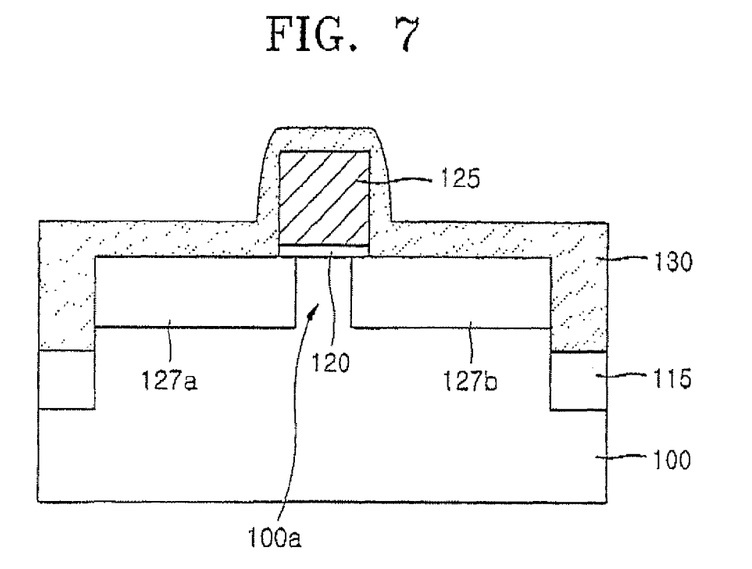
FIG. 7 is a cross-sectional view taken along line c-c' of FIG. 2 after removing an active mask.

In alternative embodiments, the gate electrode 125 may have a triple gate shape by overlapping the gate electrode 125 on three surfaces (upper and both side surfaces) of the active region 100a as shown in FIGS. 6 and 7 if the active mask 110 and the pad oxide film 105 are removed before forming the gate electrode 125. Here, FIG. 6 is a cross-sectional view taken along line a-a' in FIG. 2 after removing an active mask, and FIG. 7 is a cross-sectional view taken along line c-c' in FIG. 2 after removing an active mask. Also, the cross-sectional view taken along line b-b' in FIG. 2 after removing the active mask 110 may be the same as the cross-sectional view of FIG. 4. Therefore, additional discussion of the cross-sectional view taken along the line b-b' is omitted.

Also, the fin shaped active region 100a can be extended to a line shape or, as depicted in FIGS. 2, 5, and 7, can be isolated as an island. Also, stress can be applied in a desired direction by partial patterning the active region 100a.

Here, a hard mask film (not shown) can further be formed on the gate electrode 125, and spacers (not shown) can further be formed at the sidewalls of the gate electrode 125. The hard mask film and the spacers can be formed of the same material as the stress apply film 130, and/or they can be used as the stress apply film 130.

The active region 100a may be formed in a fin shape to increase an intensity of stress per unit area. A stress intensity may be increased since the surface area of the active region 100a to which stresses are directly applied may be substantially increased, thereby improving a mobility of carriers.

Also, a side effect of reducing a short channel effect of the MOSFET may result because the transistor is formed in a FinFET structure, and a reduction in leakage current between the junction regions 127a and 127b may result.

Figure 8:
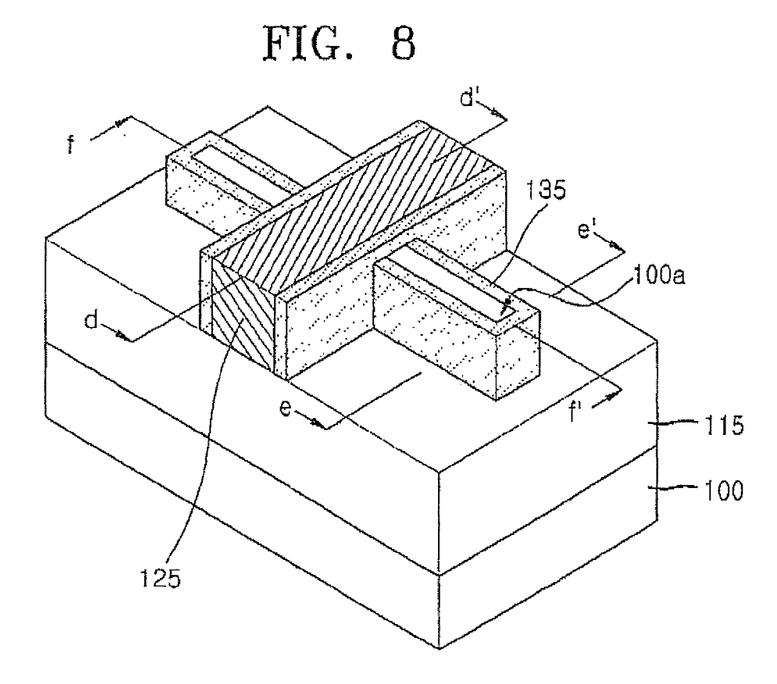
FIG. 8 is a perspective view of FinFET transistors according to other embodiments of the present invention.
Figure 9:
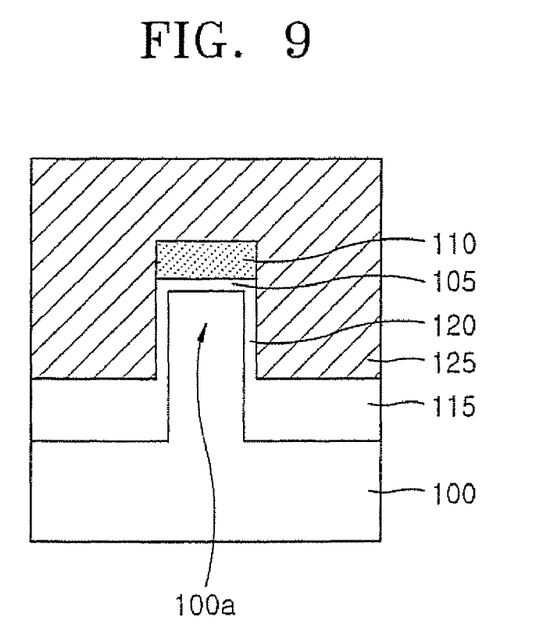
FIG. 9 is a cross-sectional view taken along line d-d' of FIG. 8.
Figure 10:
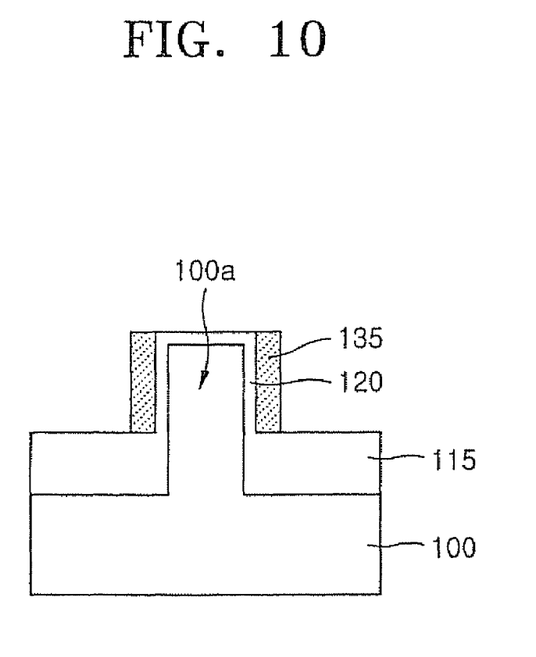
FIG. 10 is a cross-sectional view taken along line e-e' of FIG. 8.
Figure 11:
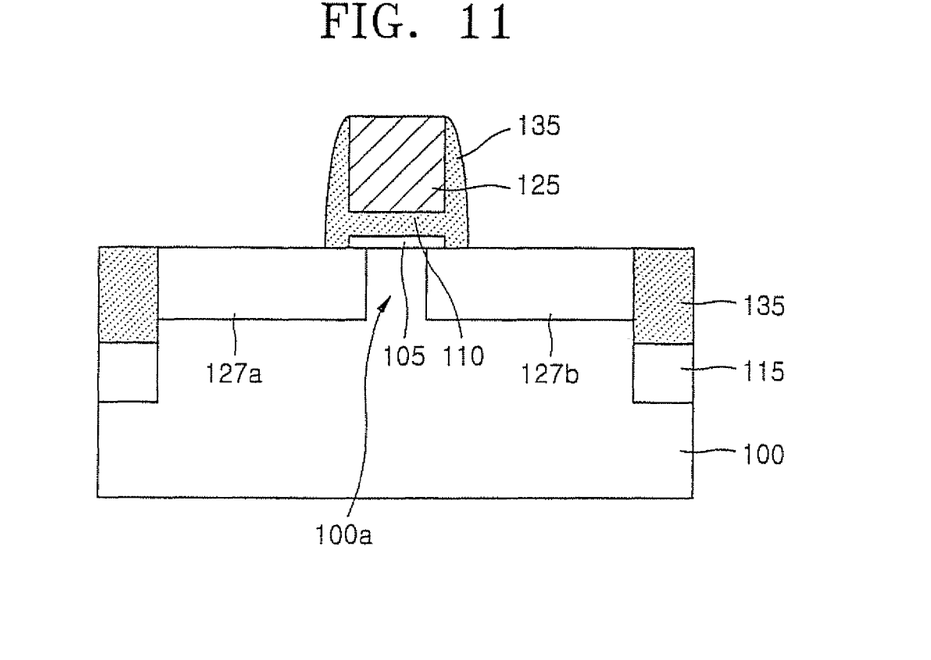
FIG. 11 is a cross-sectional view taken along line f-f' of FIG. 8.

FIG. 8 is a perspective view of a FinFET transistor according to other embodiments of the present invention. FIG. 9 is a cross-sectional view taken along line d-d' in FIG. 8, FIG. 10 is a cross-sectional view taken along line e-e' in FIG. 8, and FIG. 11 is a cross-sectional view taken along line f-f' in FIG. 8.

As shown in FIGS. 8 through 11, a stress apply film 135 according to embodiments of the present invention can be formed in a spacer shape. That is, the stress apply film 135 may be provided on both side surfaces of the active region 100a and on both side surfaces of the gate electrode 125.

Figure 12:
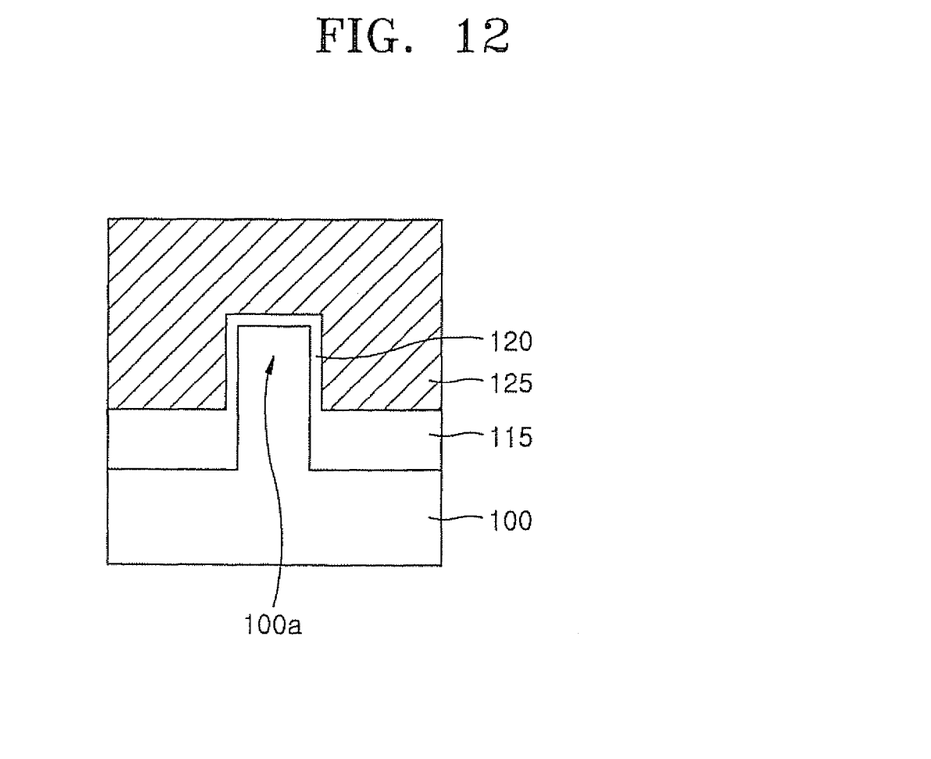
FIG. 12 is a cross-sectional view taken along line d-d' of FIG. 8 after removing an active mask.
Figure 13:
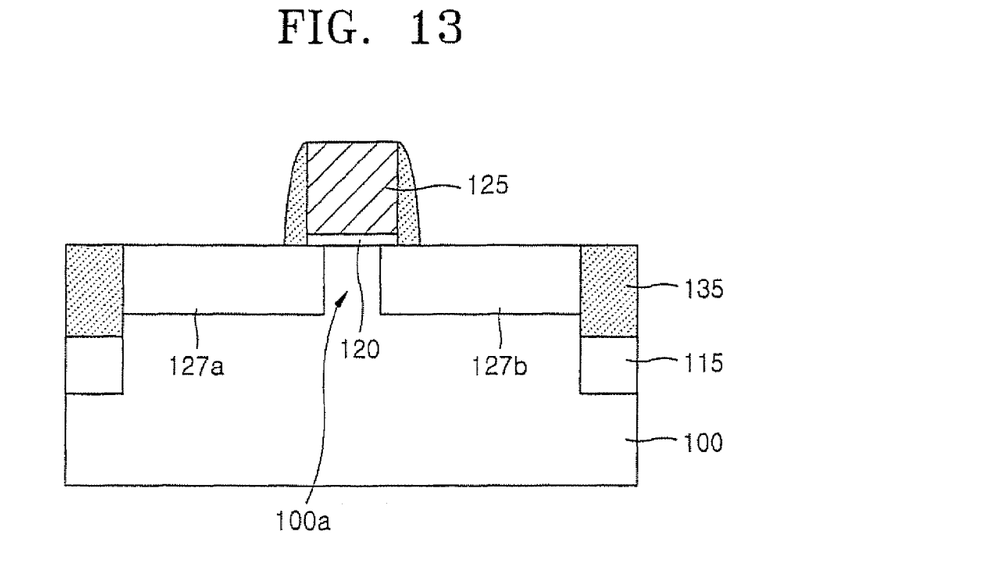
FIG. 13 is a cross-sectional view taken along line f-f' of FIG. 8 after removing an active mask.

A method of manufacturing the spacer shaped stress apply film 135 may be similar to the method of manufacturing the stress apply film 130 discussed above with respect to the FIGS. 2 through 6 and can be provided by additionally performing anisotropic etching of the stress apply film 130 (formed to have a blanket shape) to expose a surface of the gate electrode 125, a surface of the fin shaped active region 100a, and a surface of the isolation layer 115. Also, as shown in FIGS. 9 and 11, a double gate structure may be provided if the active mask 110 is not removed, and, as depicted in FIGS. 12 and 13, a triple gate structure may be provided if the active mask 110 is removed. Similar structures and steps are discussed above with respect to FIGS. 3-7.

After forming the stress apply film 135, a silicide film can be formed on the gate electrode 125 and the junction regions 127a and 127b. A high temperature annealing process for applying stress to the active region 100a can be performed between forming the stress apply film 135 and fowling the silicide film since the stress apply film 135 may be formed before forming the silicide film. As is known, if a high temperature annealing process is performed after forming a silicide film, a characteristic of the silicide film may be changed. Therefore, the annealing process may be omitted if the silicide film is formed before forming the stress apply film 135. However, a high temperature annealing may be performed if a stress apply film is formed having a spacer shape as discussed above with respect to FIGS. 8-13. A relatively high stress can be applied to the active region 100a by performing a relatively high temperature annealing process.

Figure 14:
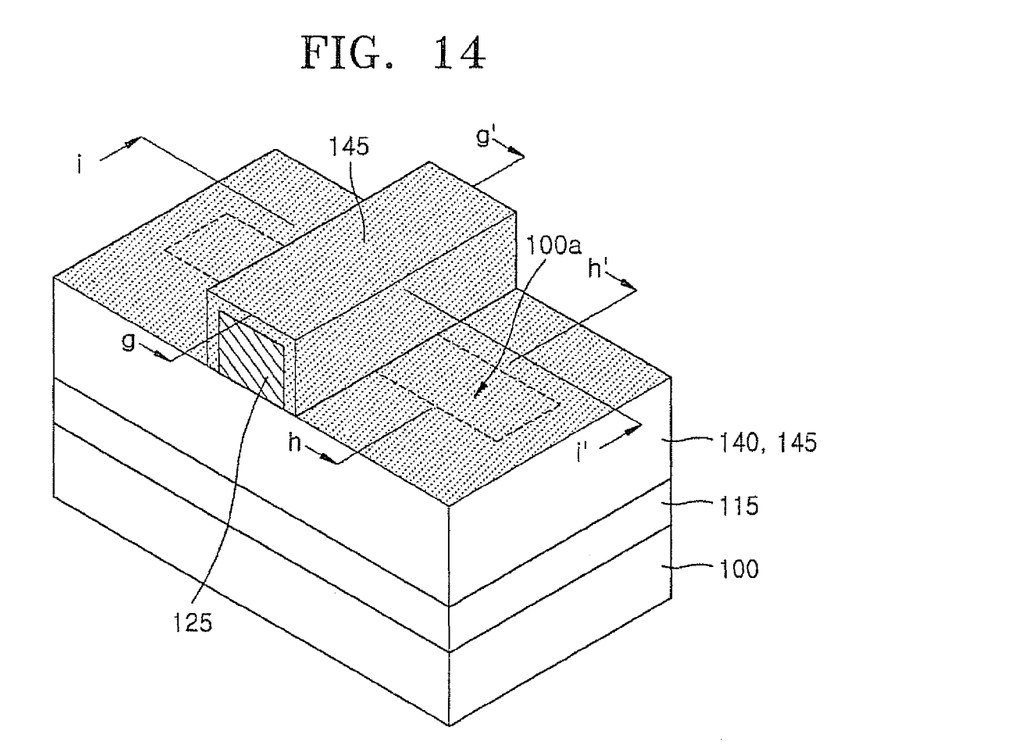
FIG. 14 is a perspective view of FinFET transistors according to yet other embodiments of the present invention.
Figure 15:
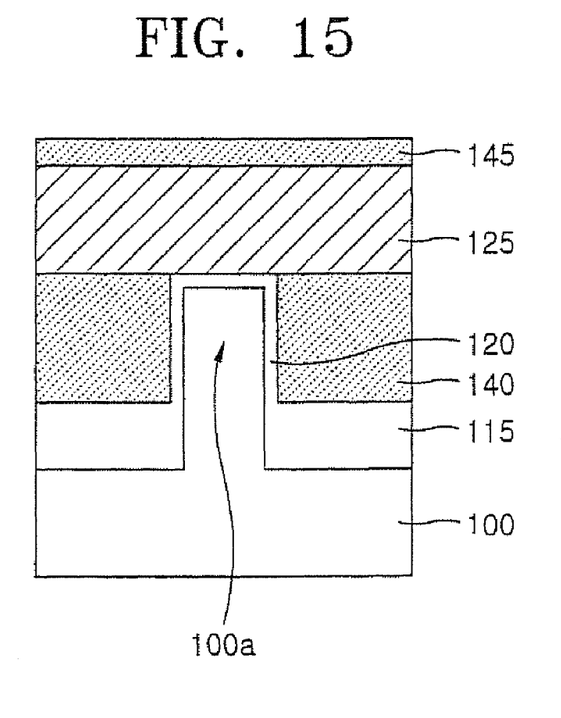
FIG. 15 is a cross-sectional view taken along line g-g' of FIG. 14.
Figure 16:
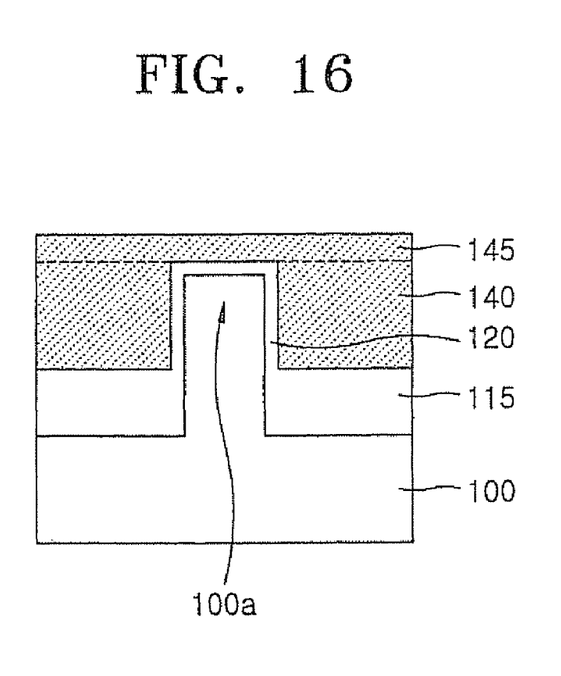
FIG. 16 is a cross-sectional view taken along line h-h' of FIG. 14.
Figure 17:
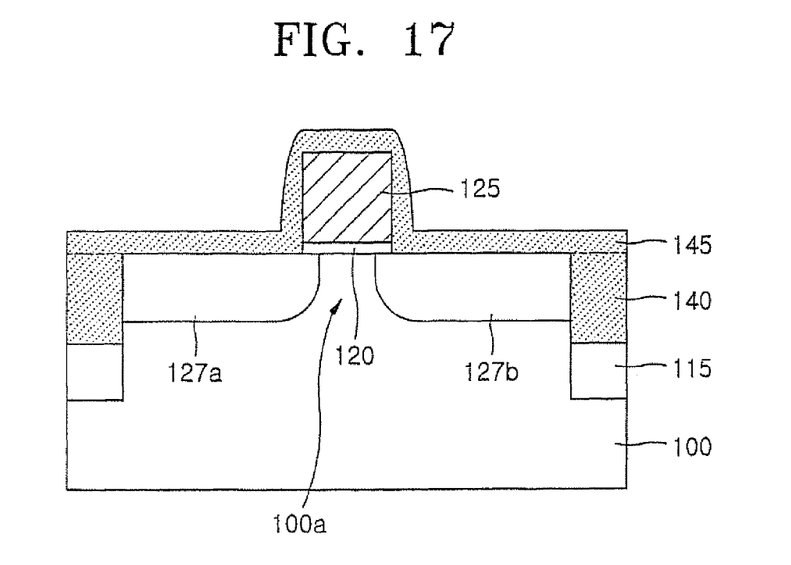
FIG. 17 is a cross-sectional view taken along line i-i' of FIG. 14.

FIG. 14 is a perspective view of a planar FinFET according to yet other embodiments of the present invention. FIG. 15 is a cross-sectional view taken along line g-g' in FIG. 14, FIG. 16 is a cross-sectional view taken along line h-h' in FIG. 14, and FIG. 17 is a cross-sectional view taken along line i-i' in FIG. 14. In FIGS. 14-17, a stress apply film may be in spaces on both sides of the active region 100a to apply an increased stress to the active region 100a.

More specifically, as discussed above with respect to FIGS. 2-13, an active region may be defined by the isolation layer 115, and an active region 100a may be defined by removing the isolation layer 115 to a predetermined depth. A gate oxide film 120 may be formed on a surface of the active region 100a.

Next, a first stress apply film 140 may be formed on the isolation layer 115 on both sides of the active region 100a. The gate electrode 125 may cross the fin shaped active region 100a on upper surfaces of the active region 100a and the first stress apply film 140, and a planar MOSFET may be completed by forming the junction regions 127a and 127b in the active region 100a on both sides of the gate electrode 125. At this time, a silicide film (not shown) may be formed on the gate electrode 125 and the junction regions 127a and 127b, and a second first stress apply film 145 may cover an upper surface of the resultant structure on which the planar MOSFET is formed.

The stress apply film of FIGS. 14-17 may cover an upper part of the active region 100*a* and may fill in spaces on both sides of the active region 100*a*. An intensity of stress may be increased because the stresses are applied from three surfaces of the active region 100*a*.

Also, a high temperature annealing may be performed on the first stress apply film 140 to apply an increased stress to the active region 100*a* since the first stress apply film 140 is formed on both sides of the active region 100*a* before forming the silicide film.

Figure 18:
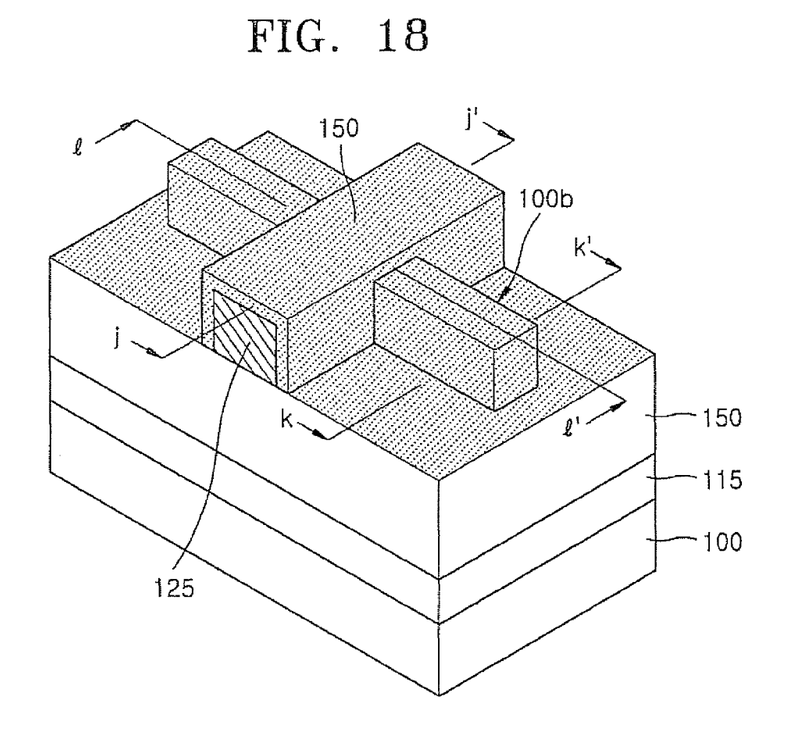
FIG. 18 is a perspective view of FinFET transistors according to yet other embodiments of the present invention.
Figure 19:
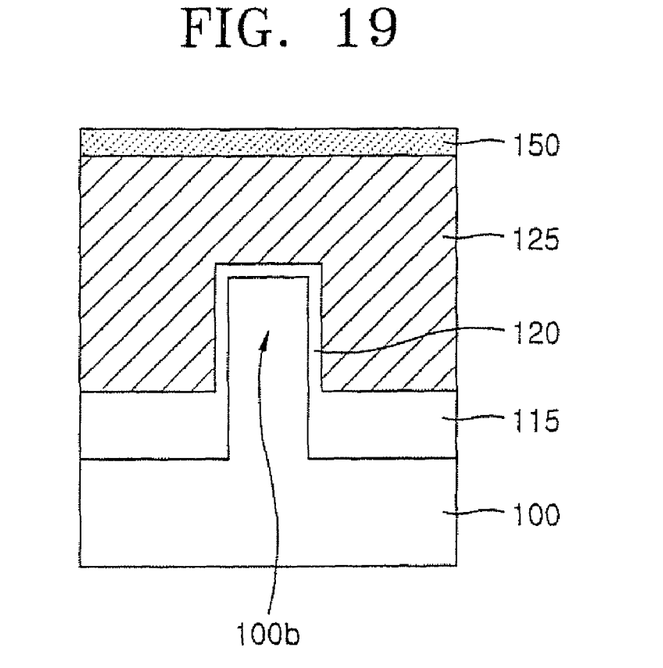
FIG. 19 is a cross-sectional view taken along line j-j' of FIG. 18.
Figure 20:
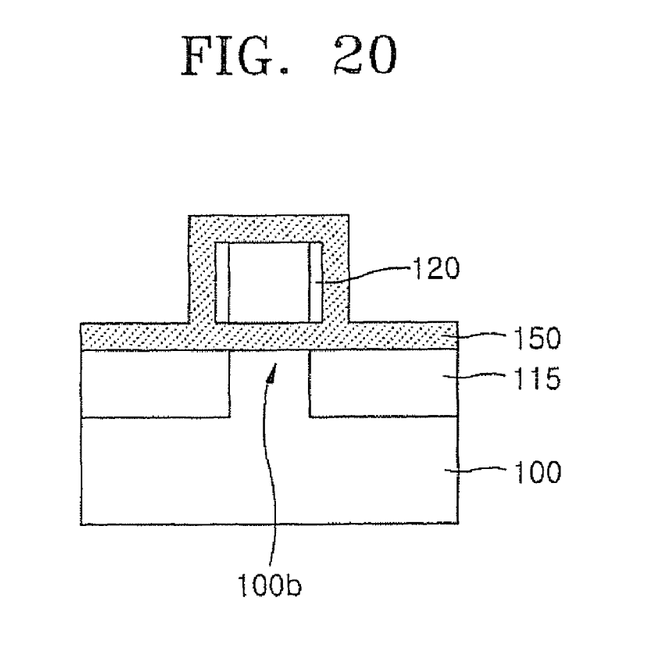
FIG. 20 is a cross-sectional view taken along line k-k' of FIG. 18.
Figure 21:
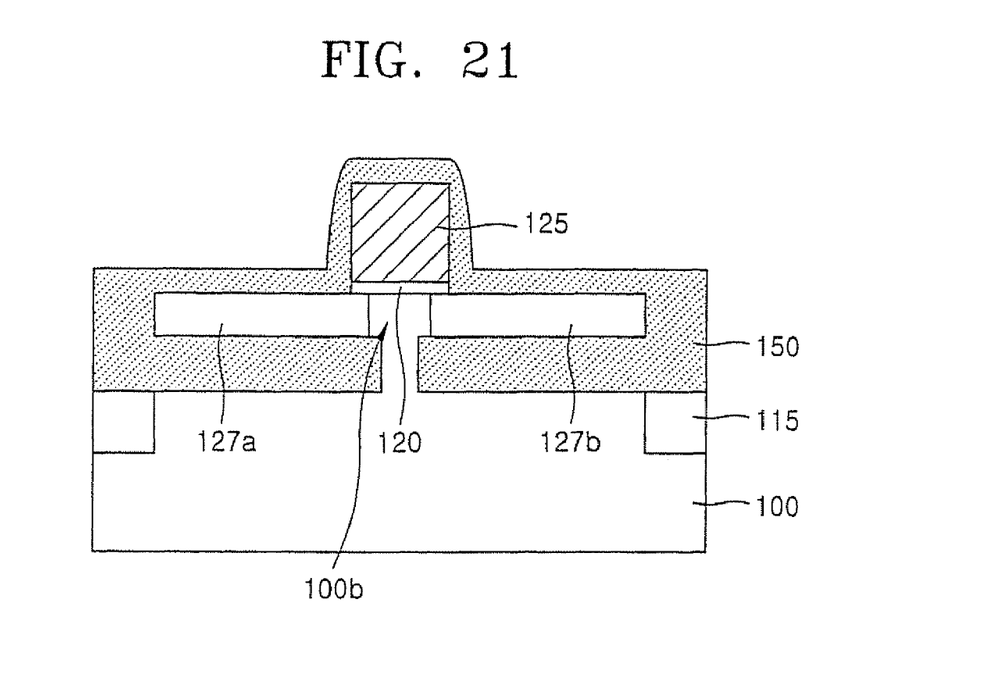
FIG. 21 is a cross-sectional view taken along line l-l' of FIG. 18.

FIG. 18 is a perspective view of a FinFET transistor according to yet other embodiments of the present invention. FIG. 19 is a cross-sectional view taken along line j-j' of FIG. 18, FIG. 20 is a cross-sectional view taken along line k-k' of FIG. 18, and FIG. 21 is a cross-sectional view taken along line l-l' of FIG. 18.

As shown in FIGS. 18 through 21, a stress apply film 150 may be formed to surround an upper part and side surfaces of the fin shaped active region 100*a* and a lower surface of the junction regions 127*a* and 127*b*. Accordingly, an intensified stress can be applied to the active region 100*a*, especially, the channel layer.

More specifically, to form the stress apply film 150 surrounding the upper part and side surfaces of the active region 100*a* and the lower surface of the junction regions 127*a* and 127*b*, a sacrifice layer (not shown) and an active layer may be provided on an upper part of the semiconductor substrate 100. The sacrifice layer may be formed to a pattern spaced a predetermined distance, and the active layer may cover the sacrifice layer and the semiconductor substrate 100. At this time, the sacrifice layer and the active layer may have lattice constants similar to that of the semiconductor substrate 100. The sacrifice layer may be formed of a material having an etch selectivity with respect to the active layer and the semiconductor substrate 100, respectively. For example, the sacrifice layer can be formed of SiGe, and the active layer and the semiconductor substrate 100 can be formed of Si. The active layer, the sacrifice layer, and the semiconductor substrate 100 may define a fin shaped structure by forming and removing the isolation layer 115.

Afterward, a space between the active layer and the semiconductor substrate 100 may be formed by selectively removing the sacrifice layer using a wet etching, and then, the active layer and the semiconductor substrate 100 may define an active region 100*b* of the present embodiment. Here, the sacrifice layer may be provided at regions for forming an upper part of the active region 100*b* and the junction regions 127*a* and 127*b*.

As discussed above, after forming the gate oxide film 120, the gate electrode 125, and the junction regions 127*a* and 127*b*, the stress apply film 150 may be coated on the resultant structure. Then, as shown in FIGS. 20 and 21, the stress apply film 150 may exist on inner sides of the active region 100*b* since the stress apply film 150 is filled not only on the resultant structure but also in the space between the active layer and the semiconductor substrate 100. Accordingly, the stress apply film 150 may surround the lower surface of the junction regions 127*a* and 127*b*.

Figure 22:
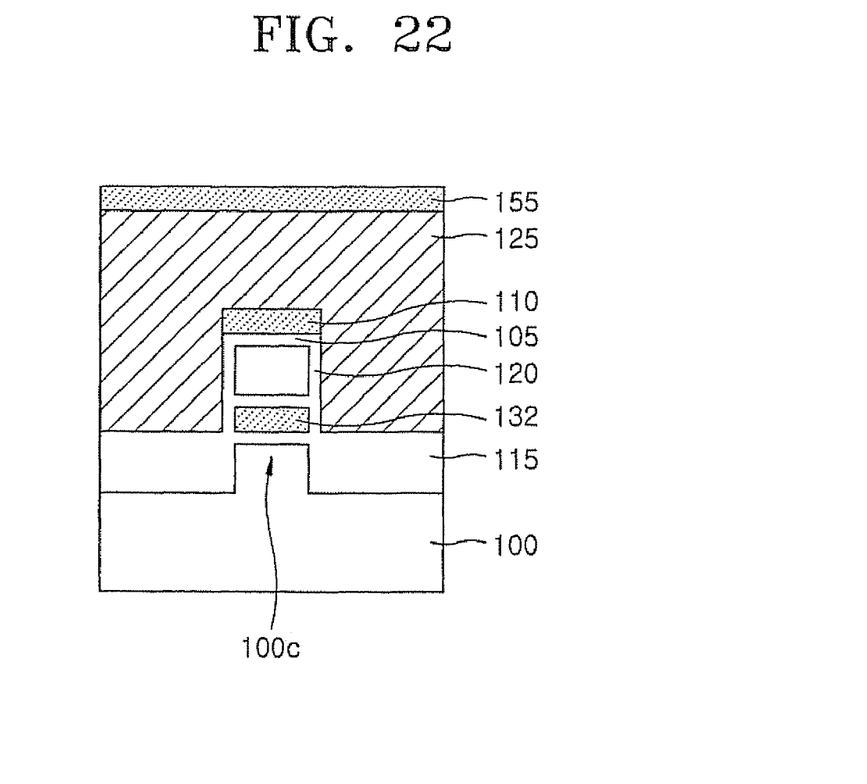
FIGS. 22 and 23 are cross-sectional views of a FinFET which show a stress apply film formed to surround a junction region and a lower surface of a channel layer according to embodiments of the present invention.
Figure 23:
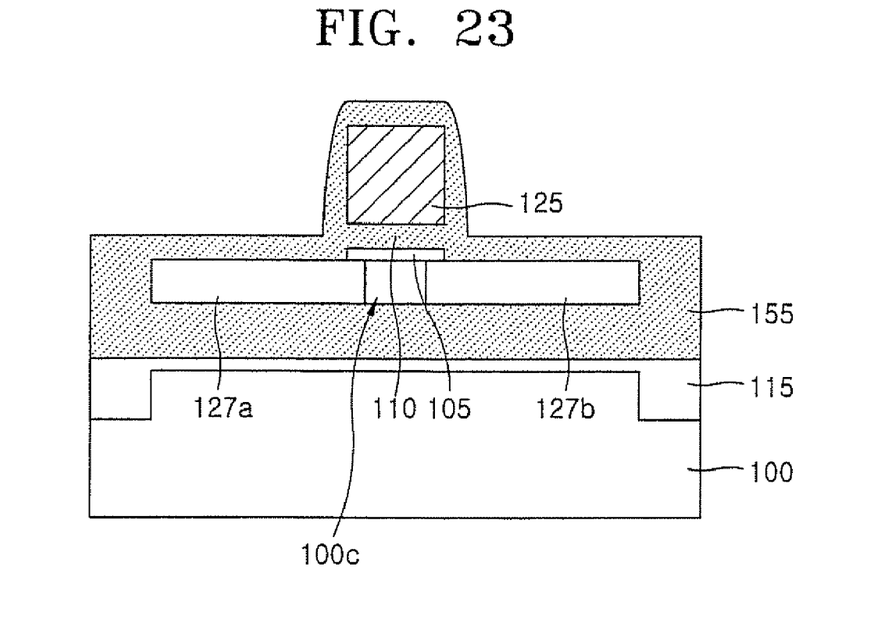

As shown in FIGS. 22 and 23, a stress apply film 155 may extend into the semiconductor substrate 100 to surround also a lower surface of the channel layer generated among upper and side surfaces of a fin shaped active region 100*c*, a surface of the gate electrode 125, the lower surface of the junction regions 127*a* and 127*b*, and junction regions 127*a* and 127*b*.

The structure of the stress apply film 155 can be manufactured by forming the sacrifice layer not a pattern but a layer remaining the active mask 110.

That is, the sacrifice layer may be formed to a pattern to be able to exist on the lower surface of the junction regions 127*a* and 127*b*. However, the sacrifice layer may be formed to a layer and removed selectively after forming an active layer on the sacrifice layer. Accordingly, a space may be provided between the active layer and the semiconductor substrate 100 and a stress apply film 132 may be interposed between the active layer and the semiconductor substrate 100 by filling the stress apply film in the space.

Also, the stress apply film 155 may be formed to be able to surround the entire surface of the active region 100*c* by maintaining the active mask 110 for defining the active region. According to embodiments of the present embodiment, an increased stress can be applied to the active region by forming a stress apply film in an inner side of the active region.

Figure 24:
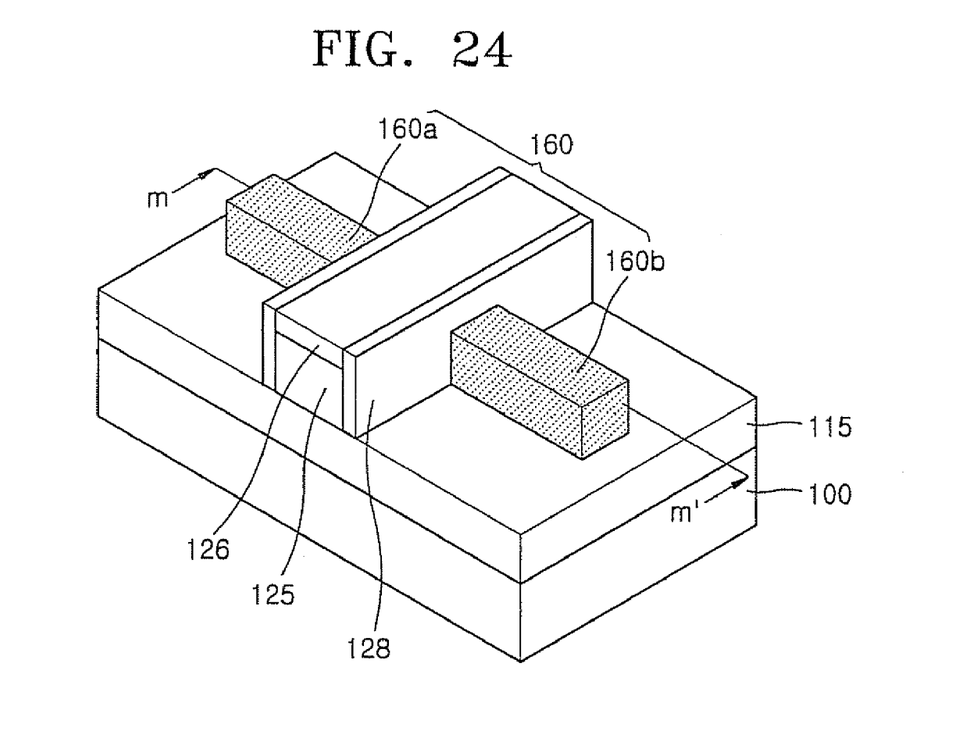
FIG. 24 is a perspective view of a FinFET according to other embodiments of the present invention.
Figure 25:
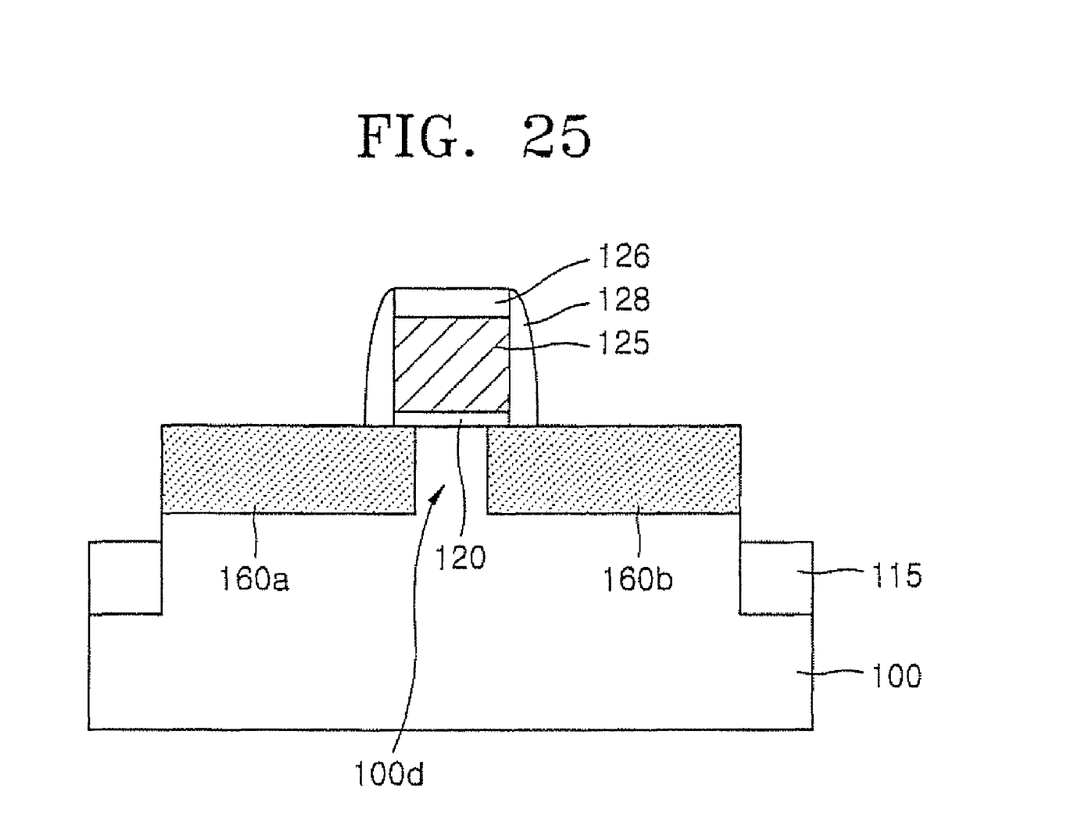
FIG. 25 is a cross-sectional view taken along line m-m' in FIG. 24.

FIG. 24 is a perspective view of a FinFET according to other embodiments of the present invention, and FIG. 25 is a cross-sectional view taken along line m-m' in FIG. 24. As shown in FIGS. 24 and 25, junction regions 160*a* and 160*b* may be formed using a stress inducing material in a relatively thin and long active region such as a FinFET. Stress can thus be applied directly to a channel region 100*d*.

More specifically, the fin shaped active region 100*a* (refer to FIG. 2) may be formed on the semiconductors substrate 100. The gate electrode 125 may be formed to cross the fin shaped active region 100*a*. At this time, a hard mask film 126 may be formed on the gate electrode 125 and spacers 128 may be formed on both sides of the gate electrode 125.

Afterward, the active region 100*a* may only remain on the channel region 100*d* by selectively removing portions of the active region 100*a* exposed by the gate electrode 125. Next, a stress inducing material may be filled in side regions (which were active regions) of the gate electrode 125 to a depth equivalent to the depth of the junction region. The stress inducing material may be an epitaxial layer.

At this time, if the remaining active region 100*a* (that is, the channel region) is formed of Si (in case of a PMOS transistor), the stress inducing material can be an epitaxial layer, such as SiGe, having a lattice constant greater than that of the channel semiconductor so as to apply compressive stress. On the other hand, if the remaining active region 100*a* (that is, the channel region) is formed of SiGe (in case of an NMOS transistor), the stress inducing material can be an epitaxial layer, such as Si, having a lattice constant less than that of the channel semiconductor so as to apply tensile stress.

The junction regions 160*a* and 160*b* formed of the stress inducing material may be formed by ion injecting a P-type dopant or an N-type dopant to the stress inducing material on both sides of the gate electrode 125.

The junction regions 160*a* and 160*b* formed of the stress inducing material may be formed in the fin shaped active region. Accordingly, stress can be directly applied to both sides of the channel region and an intensity of stress applied may be increased because the channel region has a fin shape.

Embodiments of the present invention has been described with respect to a semiconductor substrate. Embodiments of the present invention can alternatively be applied to a substrate having a structure in which a semiconductor layer is stacked on an upper part of an insulating film, such as an SOI substrate, a GOI substrate, and/or an SiGEOI substrate.

As discussed above, according to embodiments of the present invention, a stress apply film may be coated on at least a surface of an active region having a fin shaped thin film. An intensity of stress induced may be increased because the stress inducing medium may have a relatively thinner film (or a narrower line width) than a conventional one. Accordingly, an operating current of a MOSFET can be improved by an increased carrier mobility of a channel layer. In addition, a short channel effect of a MOSFET and a leakage current between a drain and source can be reduced since the active region is formed having a fin shape.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A semiconductor device comprising:
   a substrate;
   an active semiconductor region on the substrate, the active semiconductor region including a channel region between first and second junction regions wherein the channel region comprises a first semiconductor material, wherein the first and second junction regions comprise a second semiconductor material, and wherein the first and second semiconductor materials are different; and
   a gate electrode on the channel region with portions of the first and second junction regions being free of the gate electrode.

2. A semiconductor device according to claim 1 wherein the first and second junction regions have a p-type conductivity and wherein the second semiconductor material has a lattice constant that is greater than a lattice constant of the first semiconductor material.

3. A semiconductor device according to claim 2 wherein the first semiconductor material comprises silicon and the second semiconductor material comprises silicon germanium (SiGe).

4. A semiconductor device according to claim 1 wherein the first and second junction regions have an n-type conductivity and wherein the second semiconductor material has a lattice constant that is less than a lattice constant of the first semiconductor material.

5. A semiconductor device according to claim 4 wherein the first semiconductor material comprises silicon germanium (SiGe) and the second semiconductor material comprises silicon.

6. A semiconductor device according to claim 1 wherein the active semiconductor region is a fin shaped semiconductor region extending away from the substrate.

7. A semiconductor device according to claim 1 wherein the first and second semiconductor materials have different lattice constants.

8. A semiconductor device comprising:
   a substrate;
   a fin shaped semiconductor region on the substrate, the fin shaped semiconductor region including a channel region and first and second junction regions on opposite sides of the channel region wherein the channel region comprises a first semiconductor material, wherein the first and second junction regions comprise a second semiconductor material, and wherein the first and second semiconductor materials are different;
   a gate electrode on the channel region of the fin shaped semiconductor region; and
   a stress inducing layer on the fin shaped semiconductor region.

9. A semiconductor device according to claim 8 wherein the first and second semiconductor materials have different lattice constants.

10. A semiconductor device comprising:
    a substrate;
    an active semiconductor region on the substrate, the active semiconductor region including a silicon germanium (SiGe) channel region between first and second silicon (Si) junction regions; and
    a gate electrode on the silicon germanium (SiGe) channel region with portions of the first and second silicon junction regions being free of the gate electrode.

11. A semiconductor device according to claim 8 wherein the stress inducing layer is directly on sidewalls of the fin shaped semiconductor region.

12. A semiconductor device according to claim 11 wherein portions of channel region sidewalls of the fin shaped semiconductor region are free of the stress inducing layer.

13. A semiconductor device according to claim 12 wherein the stress inducing layer comprises at least one of silicon oxide and/or silicon nitride.

* * * * *